(12) United States Patent
Chih et al.

(10) Patent No.: US 6,888,754 B2
(45) Date of Patent: May 3, 2005

(54) NONVOLATILE SEMICONDUCTOR MEMORY ARRAY WITH BYTE-PROGRAM, BYTE-ERASE, AND BYTE-READ CAPABILITIES

(75) Inventors: Yue-Der Chih, Hsin-Chu (TW); Shu-Chen Chang, Hsin-Chu (TW); Hsiao-Hui Chen, Hsinchu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 24 days.

(21) Appl. No.: 10/355,997

(22) Filed: Jan. 31, 2003

(65) Prior Publication Data

US 2004/0151028 A1 Aug. 5, 2004

(51) Int. Cl.[7] .............................................. G11C 16/16
(52) U.S. Cl. ............................ 365/185.12; 365/185.13; 365/185.11; 365/185.16; 365/185.18; 365/185.02; 365/185.29
(58) Field of Search ....................... 365/185.23, 185.18, 365/185.16, 185.11, 185.12, 185.13, 185.02, 185.29, 185.33

(56) References Cited

U.S. PATENT DOCUMENTS

| | | | | |
|---|---|---|---|---|
| 5,774,412 A | * | 6/1998 | Raad et al. ............. | 365/230.06 |
| 5,812,452 A | | 9/1998 | Hoang .................... | 365/185.11 |
| 6,011,746 A | * | 1/2000 | Oh ......................... | 365/230.06 |
| 6,088,269 A | | 7/2000 | Lambertson ........... | 365/185.28 |
| 6,128,220 A | | 10/2000 | Banyai et al. ......... | 365/185.11 |
| 6,201,732 B1 | | 3/2001 | Caywood ............... | 365/185.05 |
| 6,646,950 B2 | * | 11/2003 | Akaogi .................. | 365/230.06 |

* cited by examiner

Primary Examiner—Andrew Q. Tran

(57) ABSTRACT

This invention provides a memory array and its peripheral circuit with byte-erase capability. The advantage of this invention is the ability to access bytes for program, erase, and read operations. This invention allows this access with the addition of one word line switch and one source line switch for each byte to be accessed for program, erase, and read operations. Also, this invention utilizes a new bias condition to lessen the voltage stress on the high voltage device. In addition, this invention utilizes separate and dedicated power supplies for the local word line driver circuits and for the local source line driver circuits. This is coupled with the partitioning of the main memory array into sub-arrays of 8 columns. This allows the placing of high voltage only on the selected 8 column (byte) subarray. This also substantially lessens the voltage stress on the memory cells and enhances long-term reliability.

31 Claims, 4 Drawing Sheets

Cell structure and it's schematic representation

NONVOLATILE SEMICONDUCTOR MEMORY ARRAY WITH BYTE-PROGRAM, BYTE-ERASE, AND BYTE-READ CAPABILITIES

BACKGROUND OF THE INVENTION

1. Field of the Invention

This invention relates to a memory array and peripheral circuits and methods for writeable memory technologies.

More particularly this invention relates to providing a memory array and peripheral circuits which allow byte access for programming, erasing and reading.

In addition, this invention relates to the ability of providing enhanced long-term reliability for memory arrays by reducing the cumulative voltage stressing of writeable memory arrays.

2. Description of Related Art

Memory cells which can be programmed and erased and re-programmed are known as Electrically, Erasable Programmable Read Only Memory, EEPROM. In the prior art, there are known types of memory arrays and peripheral circuits which are used with EEPROM, flash memory, or non-volatile memory. The main deficiencies of the prior art are the inability to access the memory arrays on a byte basis for programming, erasing and reading the memory arrays. Another deficiency of the prior art is the large amount of voltage stress required to program and erase the memory cells of the array.

U.S. Pat. No. 5,812,452 (Hoang) "Electrically Byte-Selectable and Byte-Alterable Memory Arrays" describes a memory array which utilizes a byte (block) select transistor to allow the memory cells to be accessed and altered on a byte basis.

U.S. Pat. No. 6,201,732 B1 (Caywood) "Low Voltage Single CMOS Electrically Erasable Read-Only Memory" describes a CMOS memory cell which can can be programmed, erased and operate at low voltages.

U.S. Pat. No. 6,128,220 (Banyai et al.) "Apparatus for Enabling EEPROM Functionality Using a Flash Memory Device" discloses a byte-alterable non-volatile memory.

U.S. Pat. No. 6,088,269 (Lambertson) "Compact Page-Erasable EEPROM Non-Volatile Memory" discloses a page erasable memory which uses two layers of conductive or semiconductive material.

BRIEF SUMMARY OF THE INVENTION

It is the objective of this invention to provide a memory array with byte access for programming, erasing and reading.

It is further an object of this invention to provide a memory array which is more reliable due to new less stressful ways of voltage biasing the memory cell for programming and erasing.

It is further an object of this invention to provide a memory array which is partitioned into sub-arrays with separate supply voltages so as to lessen the amount of high voltage which is applied to the semiconductor chip at any given time.

The objects of this invention are achieved by a memory array and its peripheral circuit with byte access capability and containing a local word line driver 0, which connects to control gates of memory cells which store data on bit lines 0–7, a local word line driver 1, which connects to the control gates of memory cells which store data on bit lines 8–15, a local source line driver 0, which connects to source lines of memory cells which store data on bit lines 0–7, a local source line driver 1, which connects to source lines of memory cells which store data on bit lines 8–15, a floating gate memory cell whose drain is connected to a bit line and whose source is connected to said local source line driver, and whose control gate is connected to said local word line driver, bit lines for a first byte of memory which are the drains of said floating gate memory cell, and bit lines for a second byte of memory which are the drains of said floating gate memory cell. The memory array and its peripheral circuit with byte-erase capability also contains a global word line primary input, which feeds two gates of two metal oxide semiconductor field effect transistor MOSFET devices located in said local word line driver circuit, a global source line primary input which feeds two gates of two MOSFET devices located in said local source line driver circuits, a voltage source for said local source line driver circuit, a voltage source for said local word line driver circuit, and a variable, virtual ground for said local word line driver circuit. The memory array and its peripheral circuit also contain bit line outputs, local word lines, and local source lines.

The memory array and its peripheral circuit with byte-erase capability has one word line switch for each byte of memory. The memory array and its peripheral circuit with byte-erase capability has one source line switch for each byte of memory. The memory array and its peripheral circuit have its even and odd rows physically separated in the semiconductor material to prevent punch-through problems. The memory array has a variable and virtual ground power supply which is used to reduce the high voltage stress on the High Voltage memory cell device. In addition, the memory array is partitioned into sub-arrays. The memory array is divided into sub-arrays which are composed of eight columns of memory cells. There are local word line driver circuits which share a dedicated power supply. Also, there are local source line driver circuits share a dedicated power supply which is different than said dedicated word line driver circuit dedicated power supply. High voltage is only applied to the power of a selected sub-array. This lessens the cumulative voltage stressing on the semiconductor chip and enhances overall chip reliability.

DETAILED DESCRIPTION OF THE INVENTION

Figure 1:
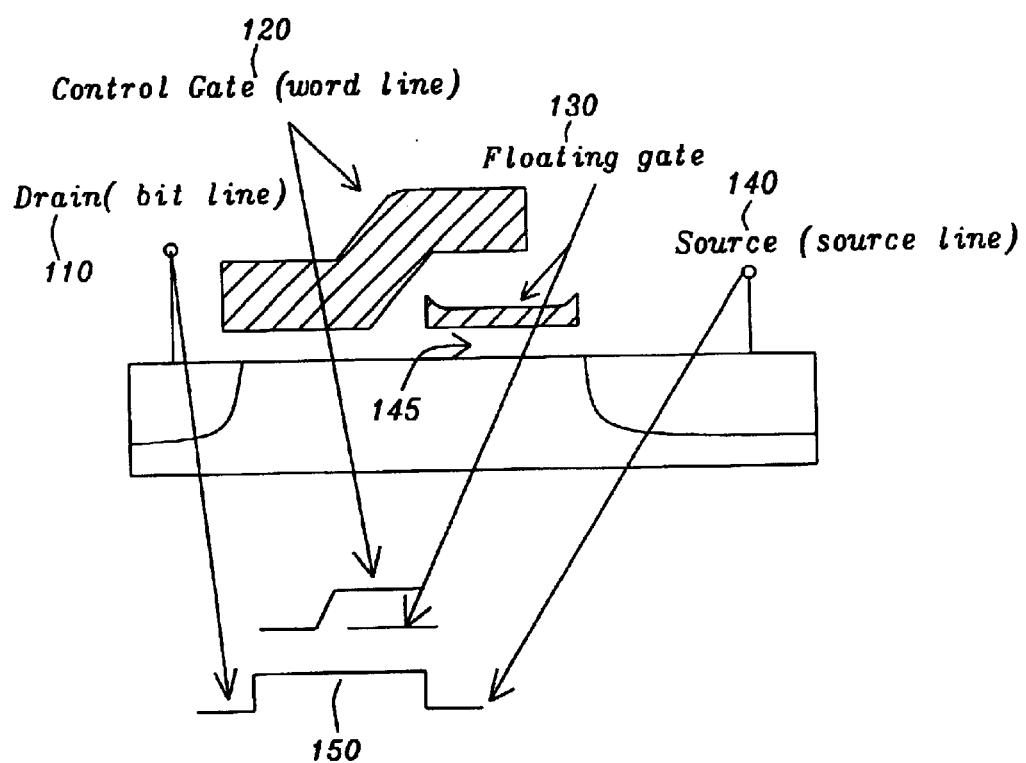
FIG. 1 shows a cross-section of the floating gate memory cell used in this invention.

FIG. 1 shows a cross-sectional view of the floating gate memory cell of this invention. Below this cross-sectional view is the device symbol representation. The floating gate 130 is shown in two views. The upper view shows the floating gate made of poly-silicon over an oxide region 145. The lower view shows the device symbol of the floating gate 130. The drain 110 of the FET memory cell is shown, attached to a bit line. Also, the source 140 is shown attached to a source line, which comes from a source line driver circuit. The control gate 120 is shown in FIG. 1. It is attached to a word line which comes from a word line driver circuit.

Figure 2:
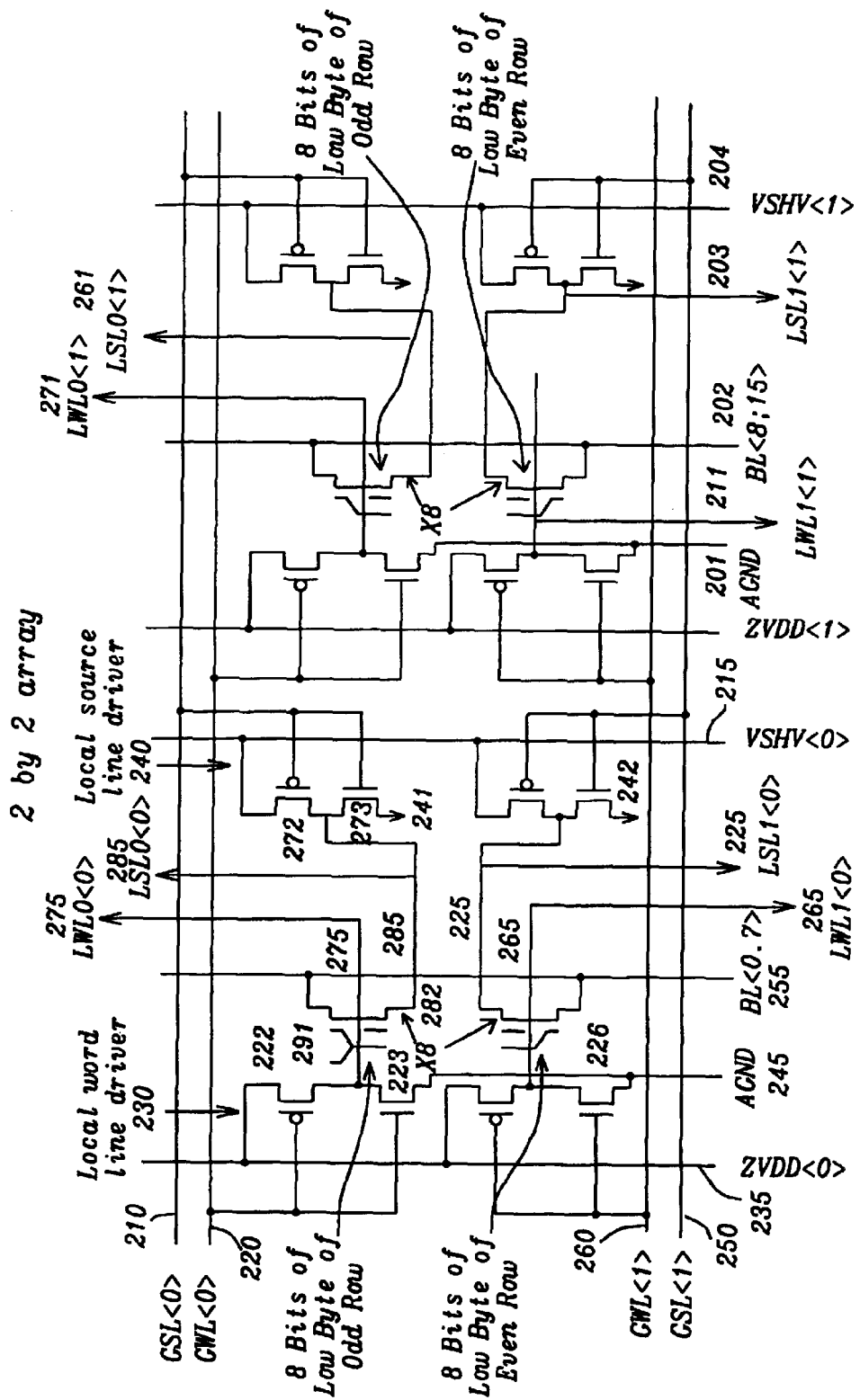
FIG. 2 shows a 2 by 2 memory array and its peripheral circuits described in this invention.

FIG. 2 shows a 2 by 2 memory array of this invention. The primary inputs include global word lines GWL<0>, GWL<1> 220, 260, which drive the gates of FET devices in the local word line driver circuits 230. The global source lines such as GSL<0> 210 is a primary input which drives the gates of FET devices in local source line driver circuits. The ZVDD<0> 235 is a dedicated supply voltage for the local word line drivers. The VSHV<0> 215 is a dedicated supply voltage for local source line drivers. The AGND 245 is a dedicated virtual and variable ground signal for local word line drivers.

FIG. 2 shows the bit lines such as BL<0:7> 255 and BL<8:15> 202. It also shows local source lines, such as LSL0<0> 285. It also shows local word lines such as LWL0<0> 275.

FIG. 2 shows local word line driver circuits such as 230. A p-channel MOSFET 222 has its drain connected to the drain of an n-channel MOSFET 223. The source of the PMOS FET 222 is connected to ZVDD 235. The source of NMOS FET 223 is connected to AGND 245. The gates of both the PMOS FET 222 and the NMOS FET 223 are both tied to the global word line driver signal GWL<0> 220.

FIG. 2 shows local source line driver circuits such as 240. A p-channel MOSFET 272 has its drain connected to the drain of an n-channel MOSFET 273. The source of the PMOS FET 272 is connected to VSHV 215. The source of NMOS FET 273 is connected to ground 241. The gates of both the PMOS FET 272 and the NMOS FET 273 are both tied to the global source line driver signal GSL<0> 210.

FIG. 2 shows the single FET memory cell 282. The control gate 291 is tied to the local word line 275. The source terminal of the memory cell device 282 is tied to the local source line 285. The drain terminal of the memory cell device 282 is connected to a bit line 255.

Figure 3:
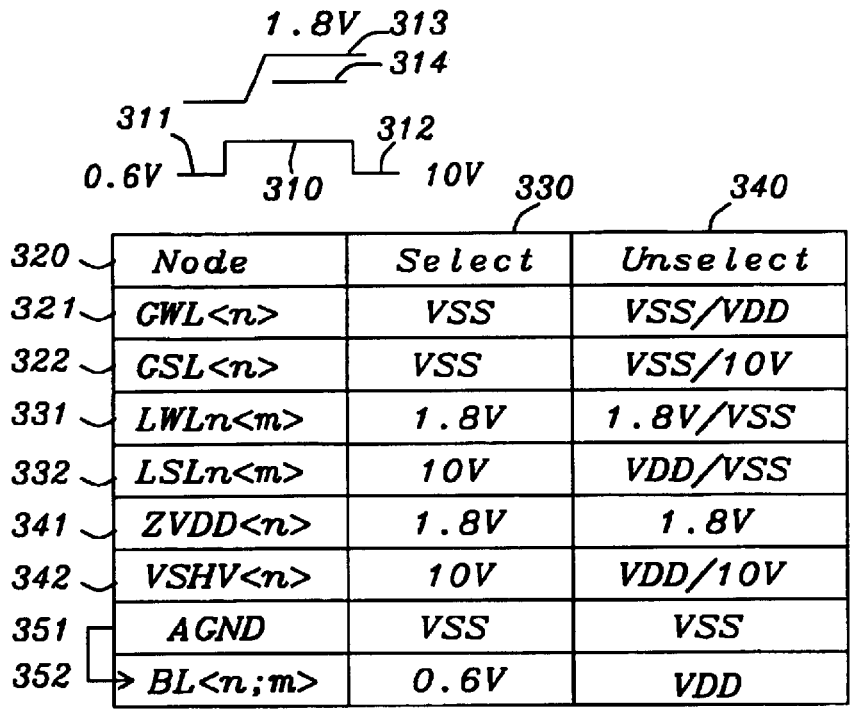
FIG. 3 shows the voltage of each node for the Selected cell and Unselected memory cells during the Programming operation.

FIG. 3 shows the voltage of the listed nodes 321, 322, 331, 332, 341, 342, 351, 352 under two different modes, the Select Mode 330 and the Unselect Mode 340 during the Program operation. The global word line, GWL, is at a low level, Vss during Select while GWL is at the higher Vdd during the Unselect mode. The global source line, GSL, is at Vss during Select Mode, while the source line is equal to 10 volts during Unselect mode. The local word line, LWL, is designed to be 1.8 volts during Select and equal to Vss during Unselect mode.

The local source line, LSL is set to 10 volts during the Select mode and is set to Vss during the Unselect mode as can be seen in FIG. 3. ZVDD the variable power supply is designed to be equal to 1.8 volts for both the Select mode and the Unselect mode. The VSHV variable power supply has its voltage set to 10 volts for the Select mode and to 10 volts for the Unselect mode. The virtual, variable ground, AGND, is equal to Vss for both Select and Unselect modes. During Program operation, the bit lines are equal to 0.6 volt during the Select mode and equal to Vdd during the Unselect mode.

Figure 4:
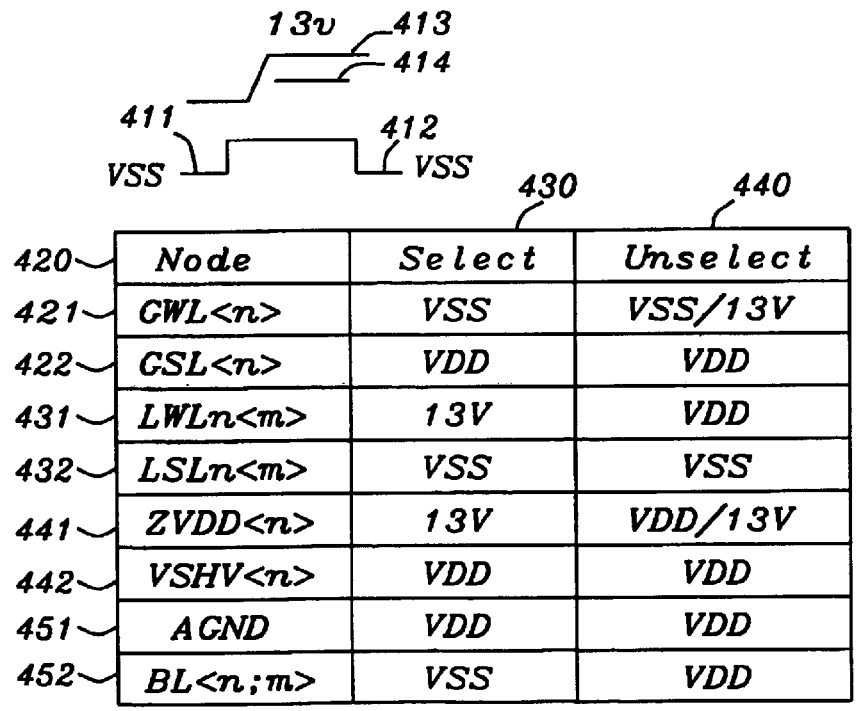
FIG. 4 shows the voltage of each node for the Selected cell and Unselected memory cells during the Erase operation.

FIG. 4 shows the voltage of the listed nodes 421, 422, 431, 432, 441, 442, 451, 452 and under two different modes, the Select Mode 430 and the Unselect Mode 440 during the Erase operation. The global word line, GWL, is at a low level, Vss during Select while GWL is at 13 volts during the Unselect mode. The global source line, GSL, is at Vdd during Select Mode, and is equal to Vdd during Unselect mode. The local word line, LWL, is designed to be 13 volts during Select and equal to Vdd during Unselect mode.

The local source line, LSL is set to Vss during the Select mode and is set to Vss during the Unselect mode as can be seen in FIG. 4. ZVDD the variable power supply is designed to be equal to 1.3 volts for both the Select mode and the Unselect mode. The VSHV variable power supply has its voltage set to Vdd for the Select mode and to Vdd for the Unselect mode. The virtual, variable ground, AGND, is equal to Vdd for both Select and Unselect modes. During Erase operation, the bit lines are equal to Vss during the Select mode and equal to Vdd during the Unselect mode.

Figure 5:
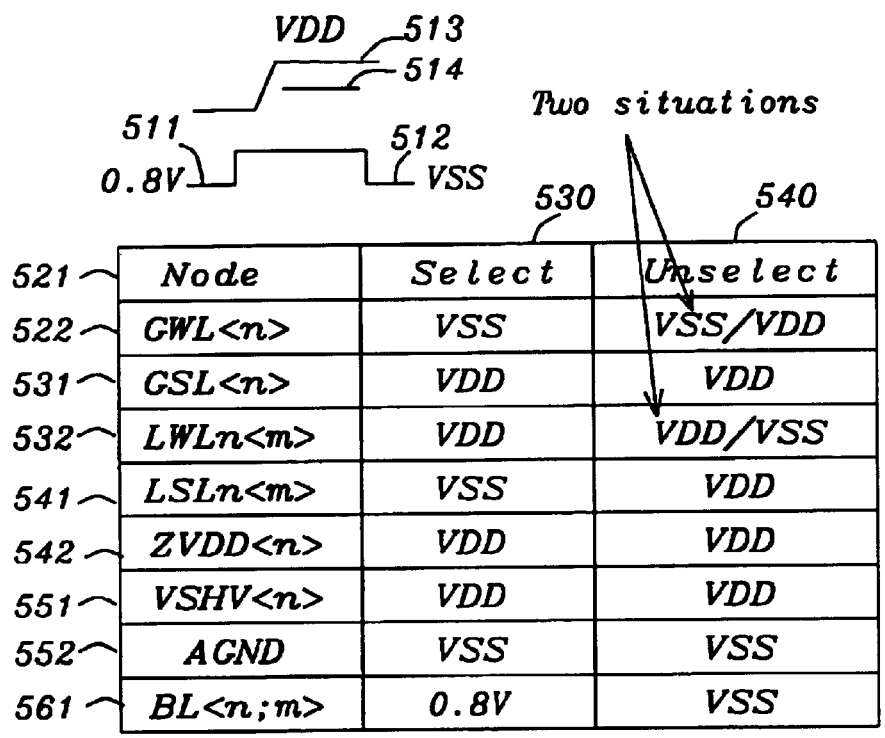
FIG. 5 shows the voltage of each node for the Selected cell and Unselected memory cells during the Read operation.

FIG. 5 shows the voltage of the listed nodes 521, 522, 531, 532, 541, 542, 551, 552 under two different modes, the Select Mode 530 and the Unselect Mode 540 during the Read operation. The global word line, GWL, is at a low level, Vss during Select while GWL is at the higher Vdd during the Unselect mode. The global source line, GSL, is at Vdd during Select Mode, and is equal to Vdd during Unselect mode. The local word line, LWL, is designed to be Vdd during Select and equal to Vss during Unselect.

The local source line, LSL is set to Vss volts during the Select mode and is set to Vdd during the Unselect mode as can be seen in FIG. 5. ZVDD the variable power supply is designed to be equal to Vdd for both the Select mode and the Unselect mode. The VSHV variable power supply has its voltage set to Vdd for the Select mode and to Vdd for the Unselect mode. The virtual, variable ground, AGND, is equal to Vss for both Select and Unselect modes. During Read operation, the bit lines are equal to 0.8 volt during the Select mode and equal to Vss during the Unselect mode.

The advantage of this invention is the ability to access bytes for program, erase, and read operations. This invention allows this access with the addition of one word line switch and one source line switch for each byte to be accessed for program, erase, and read operations. Also, this invention utilizes a new bias condition to lessen the voltage stress on the high voltage device. This is accomplished using a virtual, variable ground voltage, AGND. In addition, this invention utilizes separate and dedicated power supplies for the local word line driver circuits and for the local source line driver circuits. This is coupled with the partitioning of the main memory array into sub-arrays of 8 columns. This allows the placing of high voltage only on the selected 8 column (byte) subarray. This also substantially lessens the voltage stress on the memory devices and therefore enhances long-term reliability.

While this invention has been particularly shown and described with Reference to the preferred embodiments thereof, it will be understood by those Skilled in the art that various changes in form and details may be made without Departing from the spirit and scope of this invention.

What is claimed is:

1. A memory array and its peripheral circuit with byte-erase capability comprising:
    a first local word line driver, which connects to a first set of control gates of memory cells which store data on a first set of byte;
    a second local word line driver, which connects to a second set of control gates of memory cells which store data on a second set of byte;

a first local source line driver, which connects to a first set of source lines of memory cells which store data on said first set of byte;

a second local source line driver, which connects to said source lines of memory cells which store data on said second set of byte; and a floating gate memory cell whose drain is connected to a bit line and whose source is connected to said first or second local source line driver, and whose control gate is connected to said first or second local word line driver, wherein said bit line is shared with other unselected memory cells.

2. The memory array and its peripheral circuit with byte-erase capability of claim 1 further comprising:

a global word line primary input, which feeds two gates of two metal oxide semiconductor field effect transistor MOSFET devices located in said local word line driver circuit, a global source line primary input which feeds two gates of two MOSFET devices located in said local source line driver circuits, a voltage source for said local source line driver circuit, a voltage source for said local word line driver circuit, and a variable, virtual ground for said local word line driver circuit.

3. The memory array and its peripheral circuit with byte-erase capability of claim 1 further comprising:

bit line outputs, local word lines, and local source lines.

4. The memory array and its peripheral circuit with byte-erase capability of claim 1 wherein said local word line drivers each contain two devices, a p-channel metal oxide semiconductor field effect transistor, PMOS FET and an n-channel metal oxide semiconductor field effect transistor, NMOS FET.

5. The memory array and its peripheral circuit with byte-erase capability of claim 1 wherein said two local source line drivers each contain two devices, a p-channel metal oxide semiconductor field effect transistor, PMOS FET and an n-channel metal oxide semiconductor field effect transistor, NMOS FET.

6. The memory array and its peripheral circuit with byte-erase capability of claim 1 wherein said memory cell has a floating gate which is connected to a local word line, which comes from said local word line driver circuit, has an FET device source node which is connected to a local source line which comes from said local source line driver circuit, and has an FET device drain node which is connected to said bit line.

7. The memory array and its peripheral circuit with byte-erase capability of claim 1 wherein said local source line driver has a PMOS FET device whose drain is tied to the drain of an NMOS FET and to said local source line, and whose source is tied to a variable source power supply, and whose gate is tied to said global source line.

8. The memory array and its peripheral circuit with byte-erase capability of claim 1 wherein said local source line driver has an NMOS FET device whose drain is tied to the drain of a PMOS FET and also to said source line driver, and whose source is connected to a ground potential and whose gate is tied to said global source line.

9. The memory array and its peripheral circuit with byte-erase capability of claim 1 wherein said local word line driver has a PMOS FET device whose drain is tied to the drain of an NMOS FET and to said local word line, and whose source is tied to a variable source power supply, and whose gate is tied to said global source line.

10. The memory array and its peripheral circuit with byte-erase capability of claim 1 wherein said local word line driver has an NMOS FET device whose drain is tied to the drain of a PMOS FET and also to said word line driver, and whose source is connected to a ground potential and whose gate is tied to said global source line.

11. The memory array and its peripheral circuit with byte-erase capability of claim 1 wherein said each byte of memory contains one word line switch.

12. The memory array and its peripheral circuit with byte-erase capability of claim 1 wherein said each byte of memory contains one source line switch.

13. The memory array and its peripheral circuit with byte-erase capability of claim 1 wherein said source lines for even and odd rows are physically separated in the semiconductor material to prevent punch-through problems.

14. The memory array and its peripheral circuit with byte-erase capability of claim 1 wherein said variable and virtual ground power supply is used to reduce the high voltage stress on the High Voltage memory cell device.

15. The memory array and its peripheral circuit with byte-erase capability of claim 1 wherein said memory array is partitioned into sub-arrays.

16. The memory array and its peripheral circuit with byte-erase capability of claim 15 wherein said sub-array is composed of eight columns of memory cells.

17. The memory array and its peripheral circuit with byte-erase capability of claim 1 wherein said local word line driver circuits share a dedicated power supply.

18. The memory array and its peripheral circuit with byte-erase capability of claim 17 wherein said local source line driver circuits share a second dedicated power supply which is different than said word line driver circuit dedicated power supply.

19. The memory array and its peripheral circuit with byte-erase capability of claim 18 wherein said local source line driver dedicated power supply and said local word line driver dedicated power supply are only activated for a selected sub-array.

20. A method for producing a memory array and its peripheral circuit with byte-erase capability comprising the steps of:

including a first local word line driver, which connects to a first set of control gates of memory cells which store data on a first set of byte;

including a second local word line driver, which connects to a second set of control gates of memory cells which store data on a second set of byte;

including a first local source line driver, which connects to a first set of source lines of memory cells which store data on said first set of byte;

including a second local source line driver, which connects to said source lines of memory cells which store data on said second set of byte; and including a floating gate memory cell whose drain is connected to a bit line and whose source is connected to said first or second local source line driver, and whose control gate is connected to said first or second local word line driver, and wherein said bit line is shared with other unselected memory cells.

21. The method for producing a memory array and its peripheral circuit with byte-erase capability of claim 20 further comprising the steps of:

including a global word line primary input, which feeds two gates of two metal oxide semiconductor field effect transistor MOSFET devices located in said local word line driver circuit, including a global source line primary input which feeds two gates of two MOSFET devices located in said local source line driver circuits, including a voltage source for said local source line driver circuit, including a voltage source for said local word line driver circuit, and including a variable, virtual ground for said local word line driver circuit.

22. The method for producing a memory array and its peripheral circuit with byte-erase capability of claim 20 further comprising the steps of:

including bit line outputs, including local word lines, and including local source lines.

23. The method of producing a memory array and its peripheral circuit with byte-erase capability of claim 20 wherein said each byte of memory contains one word line switch.

24. The method of producing a memory array and its peripheral circuit with byte-erase capability of claim 20 wherein said each byte of memory contains one source line switch.

25. The method of producing a memory array and its peripheral circuit with byte-erase capability of claim 20 wherein said source lines for even and odd rows are physically separated in the semiconductor material to prevent punch-through problems.

26. The method of producing a memory array and its peripheral circuit with byte-erase capability of claim 20 wherein said variable and virtual ground power supply is used to reduce the high voltage stress on the High Voltage memory cell device.

27. The method of producing a memory array and its peripheral circuit with byte-erase capability of claim 20 wherein said memory array is partitioned into sub-arrays.

28. The method of producing a memory array and its peripheral circuit with byte-erase capability of claim 27 wherein said sub-array is composed of eight columns of memory cells.

29. The method of producing a memory array and its peripheral circuit with byte-erase capability of claim 20 wherein said local word line driver circuits share a dedicated power supply.

30. The method of producing a memory array and its peripheral circuit with byte-erase capability of claim 29 wherein said local source line driver circuits share a second dedicated power supply which is different than said word line driver circuit dedicated power supply.

31. The method of producing a memory array and its peripheral circuit with byte-erase capability of claim 30 wherein said local source line driver dedicated power supply and said local word line driver dedicated power supply are only activated for a selected sub-array.

* * * * *